(12) United States Patent
Madraswala et al.

(10) Patent No.: US 10,268,407 B1
(45) Date of Patent: Apr. 23, 2019

(54) METHOD AND APPARATUS FOR SPECIFYING READ VOLTAGE OFFSETS FOR A READ COMMAND

(71) Applicant: Intel Corporation, Santa Clara, CA (US)

(72) Inventors: Aliasgar S. Madraswala, Folsom, CA (US); Xin Guo, San Jose, CA (US); Naveen Vittal Prabhu, Folsom, CA (US); Yu Du, Santa Clara, CA (US); Purval Shyam Sule, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/721,351

(22) Filed: Sep. 29, 2017

(51) Int. Cl.
*G11C 16/26* (2006.01)
*G06F 3/06* (2006.01)

(52) U.S. Cl.
CPC .......... *G06F 3/0629* (2013.01); *G06F 3/0604* (2013.01); *G06F 3/0679* (2013.01)

(58) Field of Classification Search
CPC ..... G06F 3/0629; G06F 3/0604; G06F 3/0679
USPC .................................... 365/189.15
See application file for complete search history.

(56) References Cited

U.S. PATENT DOCUMENTS

| | | | |
|---|---|---|---|
| 8,370,719 B2 | 2/2013 | Nelson et al. | |
| 8,576,625 B1 | 11/2013 | Yang et al. | |
| 8,861,276 B2 * | 10/2014 | Shim | G11C 11/5642 365/185.18 |
| 10,120,589 B2 * | 11/2018 | Jung | G06F 3/0614 |
| 2006/0203548 A1 * | 9/2006 | You | G11C 16/10 365/185.12 |
| 2011/0182119 A1 | 7/2011 | Strasser et al. | |
| 2012/0327711 A1 * | 12/2012 | Shim | G11C 11/5642 365/185.03 |
| 2014/0219020 A1 * | 8/2014 | Kwak | G11C 16/10 365/185.03 |
| 2015/0029796 A1 | 1/2015 | Choi et al. | |
| 2016/0132256 A1 * | 5/2016 | Jung | G06F 3/061 711/103 |
| 2016/0148702 A1 | 5/2016 | Karakulak et al. | |
| 2016/0189770 A1 * | 6/2016 | Abe | G11C 11/5642 365/185.03 |
| 2017/0169893 A1 | 6/2017 | Griffin et al. | |

OTHER PUBLICATIONS

International Search Report and Written Opinion for Application No. PCT/US2018/053590, dated Jan. 28, 2019, 14 pages.

* cited by examiner

*Primary Examiner* — Xiochun L Chen
(74) *Attorney, Agent, or Firm* — Alliance IP, LLC

(57) ABSTRACT

In one embodiment, an apparatus comprises a memory array and a controller. The controller is to receive a first read command specifying a read voltage offset profile identifier; identify a read voltage offset profile associated with the read voltage offset profile identifier, the read voltage offset profile comprising at least one read voltage offset; and perform a first read operation specified by the first read command using at least one read voltage adjusted according to the at least one read voltage offset of the read voltage offset profile.

20 Claims, 8 Drawing Sheets

METHOD AND APPARATUS FOR SPECIFYING READ VOLTAGE OFFSETS FOR A READ COMMAND

FIELD

The present disclosure relates in general to the field of computer development, and more specifically, to memory reading procedures.

BACKGROUND

A computer system may include one or more central processing units (CPUs) that may be coupled to one or more storage devices. A CPU may include a processor to execute software that utilize the storage devices coupled to the CPU. The software may write data to the storage devices and read data from the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
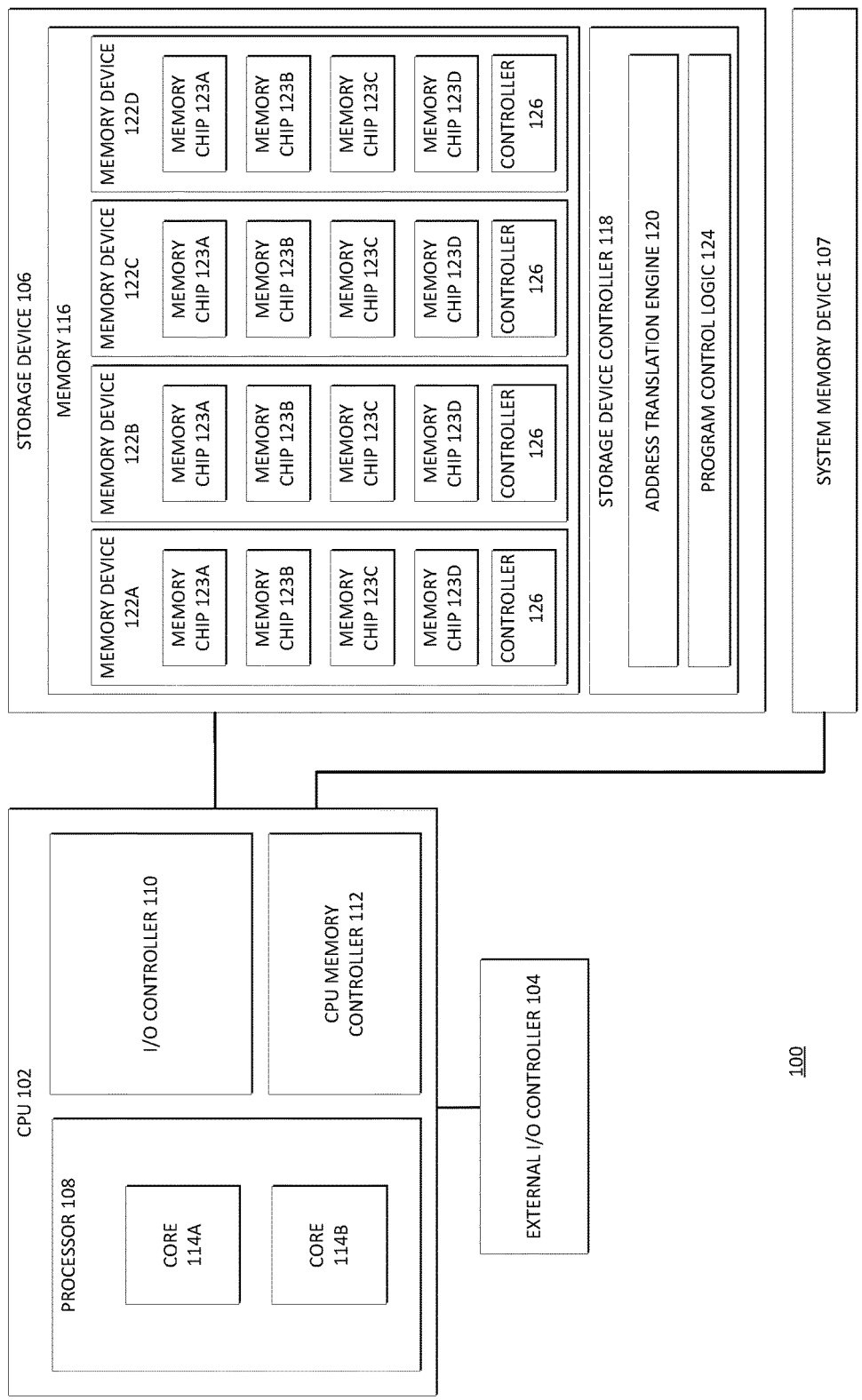
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

In various embodiments, storage device 106 may include one or more memory arrays comprising memory cells that each store one or more bits of data. A read operation may include applying one or more read voltages to the array (e.g., to a wordline of the array) and sensing memory cells to determine whether the read voltages activated the cells (e.g., caused the memory cells to conduct). For example, a cell may be activated if the threshold voltage (Vt) of the cell is lower than the read voltage. The Vt of a cell may indicate the value of one or more bits stored by the cell.

Over time, after being set to a particular Vt during programming, the Vt of a NAND cell may shift due to intrinsic charge loss. In order to accurately read the value stored by memory cells in an array, the read voltages may need to be adjusted to account for shifting of the threshold voltages of the cells. The overhead involved in specifying individual offsets for read voltage levels for read operations may be substantial and may negatively affect read performance (and the overhead may increase drastically as the numbers of bits stored by the memory cells of the array increases due to the increased number of read voltage levels used during a read operation).

In various embodiments, a read voltage offset profile may be stored in association with a memory array. The read voltage offset profile may specify a read voltage offset for each read voltage used in a read operation. For example, the read voltage offset profile may specify a first offset for a first read voltage, a second offset for a second read voltage, and so on. The read voltage offset profile may be associated with a profile identifier.

In particular embodiments of the present disclosure, when the read voltages are to be adjusted during a read operation, a read command specifying a profile identifier of a desired read voltage offset profile may be issued by a storage device controller 118 (e.g., a NAND controller) to the memory array. The memory array determines the read voltage offset profile associated with the received profile identifier and adjusts the read voltages applied during the read operation as specified by the offsets in the profile. In various embodiments, the profile identifier may be specified during an address cycle of the read command or during a command cycle of the read command (e.g., via an opcode). Various embodiments of the present disclosure may significantly reduce overhead associated with the adjustment of read voltages. Particular embodiments may relax the period of background data refresh as well. In some systems, data that has aged significantly may need to be refreshed (e.g., read out and programmed again) in order to maintain the ability to accurately read the data. The ability to adjust the read voltages without undue overhead may allow the data to age further without a refresh operation while still preserving the ability to accurately read the data.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, sub-blocks, planes, wordlines, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may provide the various voltages (and/or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
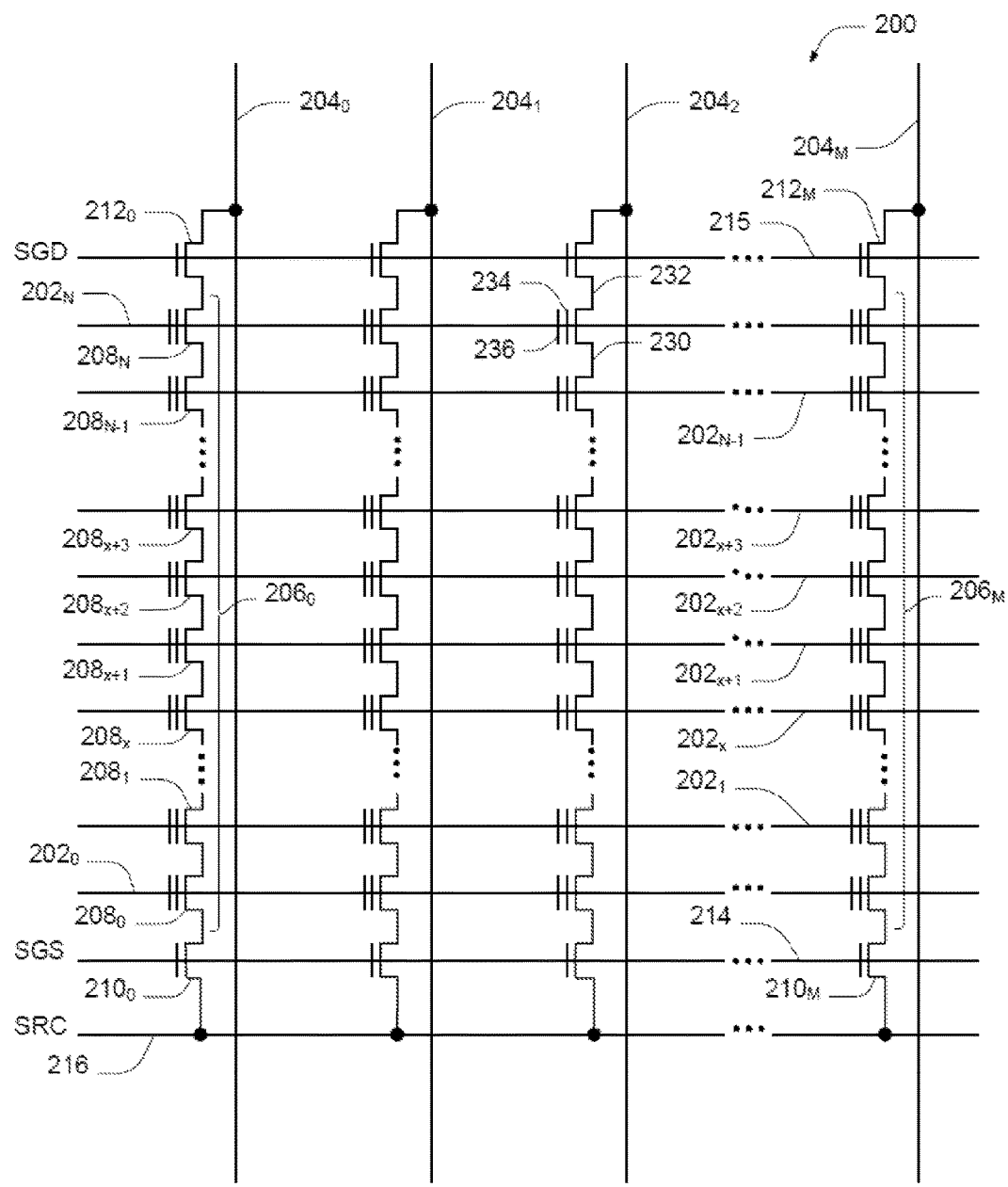
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line. In a particular embodiment, a drain select line may be coupled to the drain select transistors of an entire subblock (and each subblock may have its own drain select line) while a source select line may be coupled to the source select transistors of an entire block (and each block may have its own source select line).

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line 202N and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. For particular memory devices, all memory cells of a particular subblock commonly connected to a given word line may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

During sensing (e.g., reading) of a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
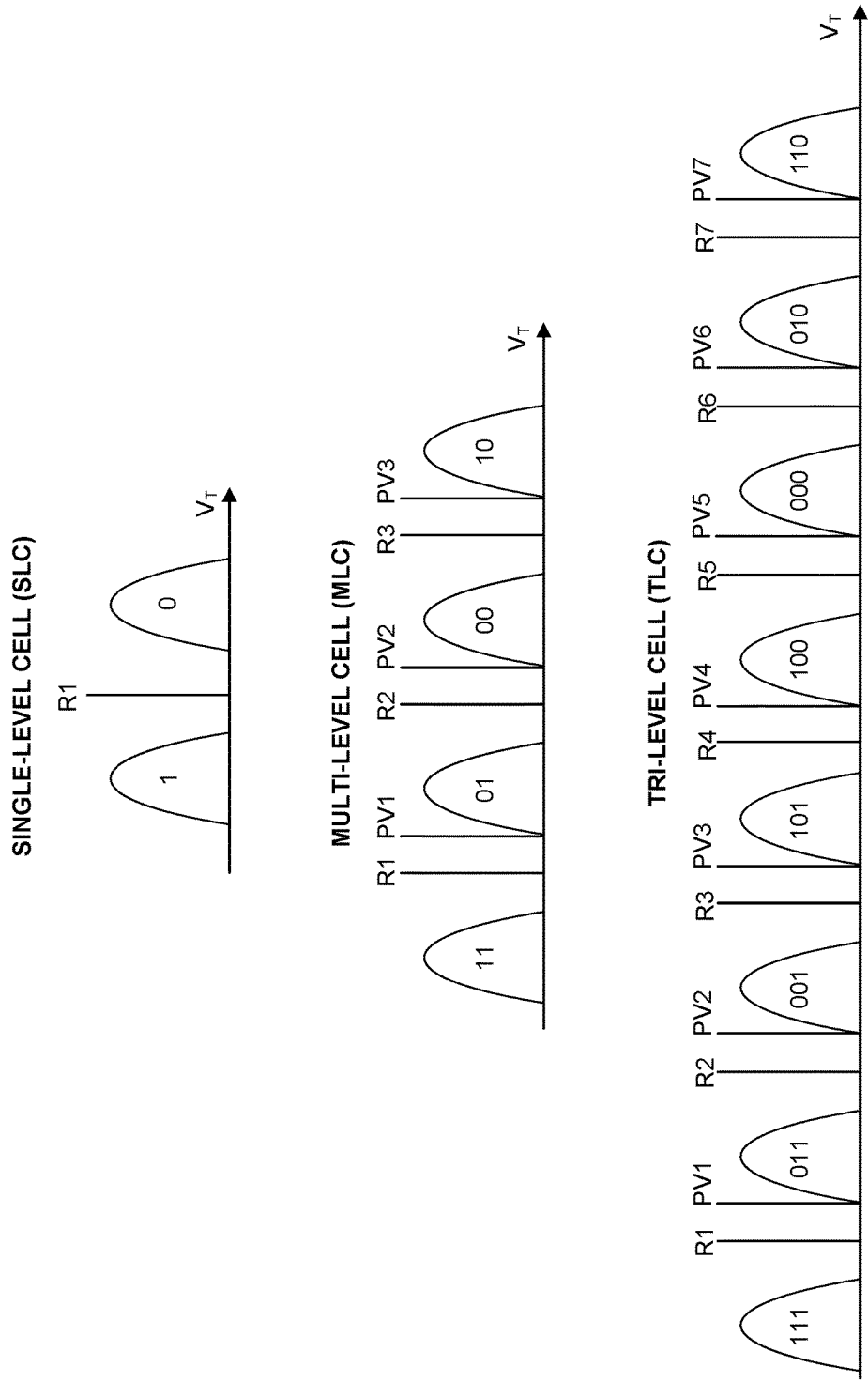
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline (e.g., a physical page). For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during the programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage over time and to improve sensing accuracy. For example, the figure depicts a margin between R1 and PV1, a margin between R2 and PV2, and so on.

As described above, the program levels may shift over time (i.e., the threshold values of cells programmed to a particular program level may change). The program levels also may not be uniform across the pages of a memory array. Accordingly, it may not be ideal to use the same read voltages for each physical page (or even for the same physical page during different read operations).

Various embodiments of the present disclosure allow read commands to specify a read voltage offset profile identifier specifying a read voltage offset profile to be applied to one or more read operations specified by the read command. A read voltage offset profile may include one or more read voltage offsets that are to be used to adjust one or more read levels during a read operation. For example, a read voltage offset profile for an SLC memory may include a single read voltage offset, a read voltage offset profile for an MLC memory may include three read voltage offsets, a read voltage offset profile for a TLC memory may include seven read voltage offsets, and a read voltage offset profile for a QLC memory may include 15 read voltage offsets. As an example, referring to FIG. 3, a first read voltage offset of a profile for an MLC memory may specify an amount that R1 should be shifted, a second read voltage offset of the profile may specify an amount that R2 should be shifted, and a third read voltage offset of the profile may specify an amount that R3 should be shifted. The read voltage offsets may specify a positive amount, a negative amount, or no offset. In a particular embodiment, the read voltage offsets are constrained within a range. For example, valid values for read offsets voltages may be between −1270 mV and +1270 mV. In other embodiments, any suitable range may be used. In a particular embodiment, the read voltage offsets are constrained to a particular granularity. For example, the resolution between successive read voltage offsets may be 10 mV or other suitable value. In various embodiments, a read voltage offset profile may include read voltage offsets for only a subset of the read voltages and the unspecified read voltage offsets may be assumed to be zero.

Figure 4:
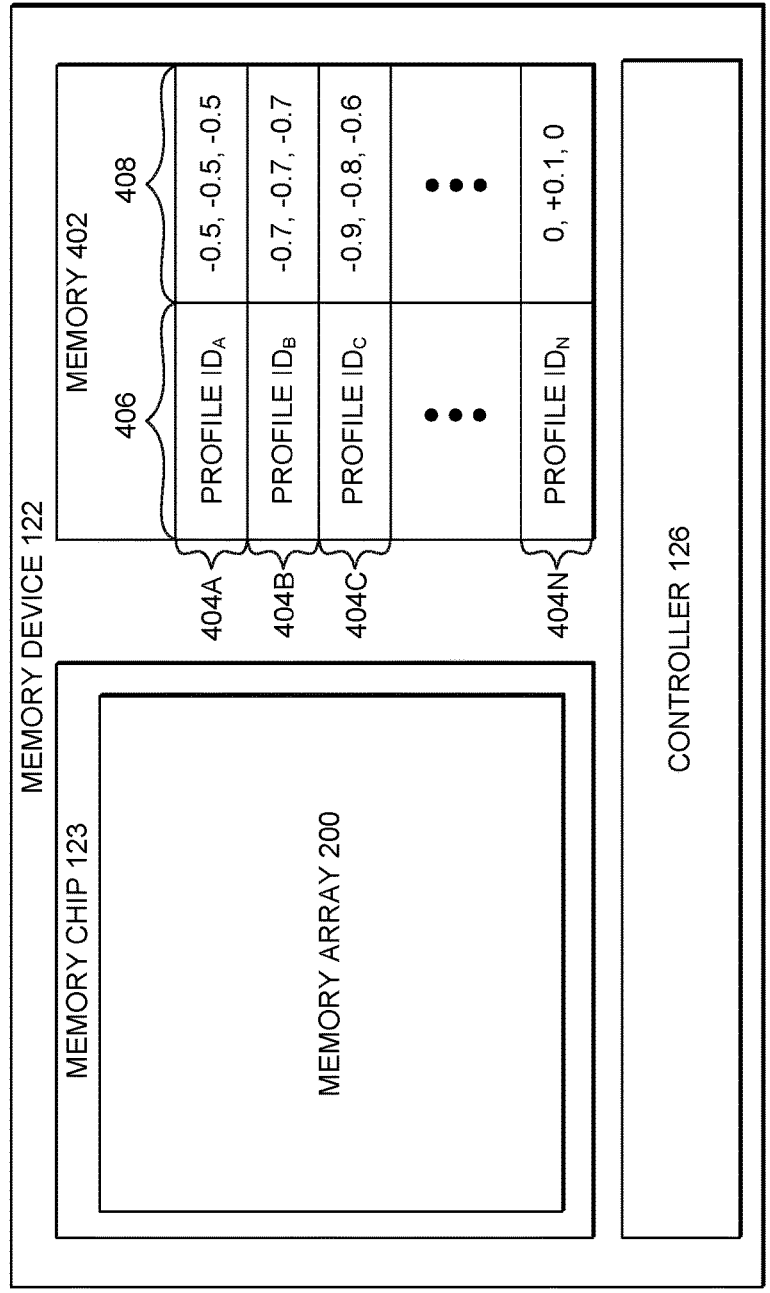
FIG. 4 illustrates an example memory device comprising a memory to store read voltage offset profiles in accordance with certain embodiments.

FIG. 4 illustrates an example memory device comprising a memory 402 to store read voltage offset profiles in accordance with certain embodiments. The memory device may comprise at least one memory chip 123 and at least one controller 126 (in various embodiments, a controller 126 may be located on a different chip from memory chip 123 or on the same chip as memory chip 123). In some embodiments, a plurality of memory chips 123 may share a controller 126. In alternative embodiments, each memory chip 123 may have a dedicated controller 126. In various embodiments, a memory device 122 may include a controller 126 that interfaces with storage device controller 118 and a controller on each memory chip 123 that interfaces with the first controller (in various embodiments, the storage device controller 118 may communicate with the chip level controllers via the device level controller). In various embodiments, any suitable control logic located on storage device 106, memory device 122, and/or memory chip 123 may be considered a "controller" that performs operations described herein (thus logic distributed throughout different components of the storage device 106 may be considered to be a single controller in some embodiments). For example, controller 126 may comprise control logic located on the memory device 122 on a chip separate from memory chip 123, control logic located on a memory chip 123, or a combination of control logic located on the memory device 122 on a chip separate from memory chip 123 and control logic located on memory chip 123.

Memory device 122 may include at least one memory 402 for storing read voltage offset profiles. Memory 402 may be located on a memory chip 123 or on a different chip of the memory device 122. In a particular embodiment, each memory chip 123 and/or memory array includes its own dedicated memory to store read voltage offset profiles. In some embodiments, a plurality of memory chips 123 and/or arrays within one or more memory chips 123 may share memory 402.

Memory 402 may include a plurality of entries 404 (e.g., 404A, 404B, . . . 404N) that each include a profile identifier 406 and a corresponding set of read voltage offsets 408. Memory 402 may store any suitable number of entries 404. The embodiment depicted shows profiles for an MLC scheme in which three read voltages are used during a read operation. In various embodiments, the memory may be adapted to store any suitable number of read voltage offsets for each profile. Memory 402 may include any suitable type of volatile or non-volatile memory. In various embodiments, the storage device controller 118 may send a command to memory device 122 that results in one or more profiles being stored in memory 402 (in various embodiments, controller 126 may facilitate this operation).

Controller 126 may perform any suitable functionality of memory device 122. In various embodiments, controller 126 may control program and read operations of one or more memory arrays 200 of one or more memory chips 123. Controller 126 may also be operable to receive a read command that specifies a profile identifier, retrieve the read voltage offsets from memory 402, and adjust the read voltages based on the offsets for the read operation. In other embodiments, any other suitable logic of the memory device 122 or storage device 106 (e.g., a memory chip level controller) may perform any one or more of these functions.

Figure 5:
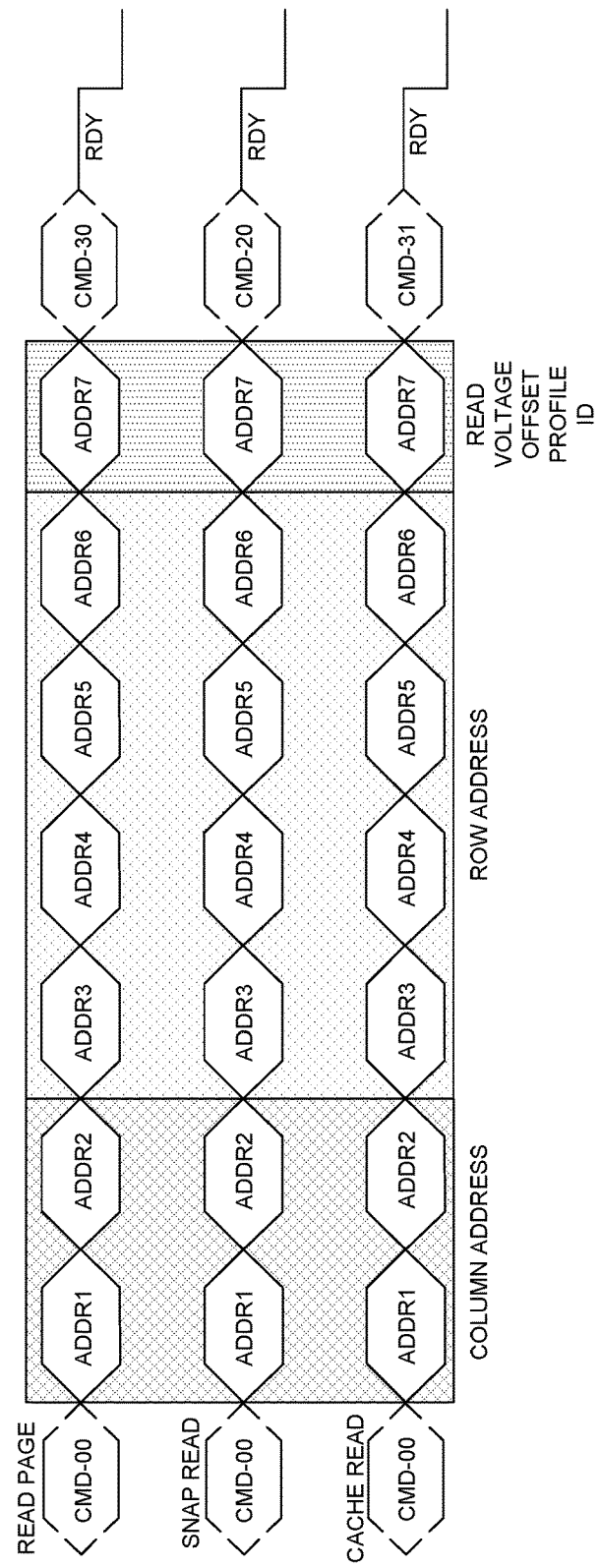
FIG. 5 illustrates example read commands including read voltage offset profile identifiers in an address cycle in accordance with certain embodiments.

FIG. 5 illustrates example read commands including read voltage offset profile identifiers in an address cycle in accordance with certain embodiments. In the embodiment depicted, each read command comprises a command cycle dedicated to communicate an opcode, followed by a plurality of address cycles and another command cycle dedicated to communicate another opcode. In the embodiment depicted, the opcode in the first command cycle (i.e., 00 in hexadecimal (h) notation) is common among the read commands and the opcodes in the second command cycle (i.e., 30 h, 20 h, and 31 h) are unique to the particular type of read command (e.g., read page, snap read, or cache read). The read commands each include two address cycles dedicated to a column address, four address cycles dedicated to a row address, and a single address cycle dedicated to a read voltage offset profile identifier. In other embodiments, the read command may include any suitable number of command cycles and address cycles (for example, a read command may include four address cycles, five address cycles, six address cycles, seven address cycles, eight address cycles, or other suitable number of address cycles).

In the embodiment depicted, the last address cycle immediately prior to the last command cycle is dedicated to communicate the read voltage offset profile ID. In various embodiments, any suitable address cycle may be dedicated to carry the read voltage offset profile ID. For example, in a particular embodiment, the first address cycle after the first command cycle may include the read voltage offset profile ID and the remaining address cycles may include address information for the read command.

In a particular embodiment, the read command may be sent over a bus that couples the storage device controller 118 to a controller 126 of a memory device 122. In a particular embodiment, the bus may include a set of multipurpose data lines (e.g., eight or sixteen lines) and one or more control lines that allow the memory device controller 126 to interpret the type of data being sent over the multipurpose data lines during a particular cycle. For example, the bus may include a command latch enable signal (or other similar signal line) that is asserted during a command cycle when the data on the multipurpose data lines define a command. As another example, the bus may include an address latch enable signal (or other similar signal line) that is asserted during an address cycle when the data on the multipurpose data lines define an address. In a particular embodiment, the address latch enable signal may also be asserted during an address cycle in which the data on the multipurpose data lines define a read voltage offset profile ID.

The value on the multipurpose data lines of the bus during the address cycle dedicated to the read voltage offset profile ID corresponds to the profile to be used for the accompanying read command. In a particular embodiment, a particular value (e.g., x00 on the data lines when there are eight data lines) may refer to a default profile which results in no read voltage offsets being applied in response to the command (in some embodiments, other read voltage offsets may be applied by controller 126 independent of the read voltage offset profiles). At least some of the remaining possible values on the data lines may be mapped to valid read voltage offset profile IDs. In various embodiments, if the number of profiles is greater than the number of profile IDs that may be represented in one address cycle, multiple address cycles may be used to communicate the profile ID.

In some embodiments, the additional address cycle for read commands may be selectively enabled for a memory chip 123 by sending a command from the storage device controller 118 to a memory device controller 126. When the additional address cycle is not enabled, the read commands may be sent using one less address cycle than read commands sent when the additional address cycle is enabled. In particular embodiments in which the read commands include an extra address cycle for carrying the read voltage offset profile ID, one or more erase and program commands may also include an extra address cycle which is considered invalid (i.e., it is ignored by controller 126).

Figure 6:
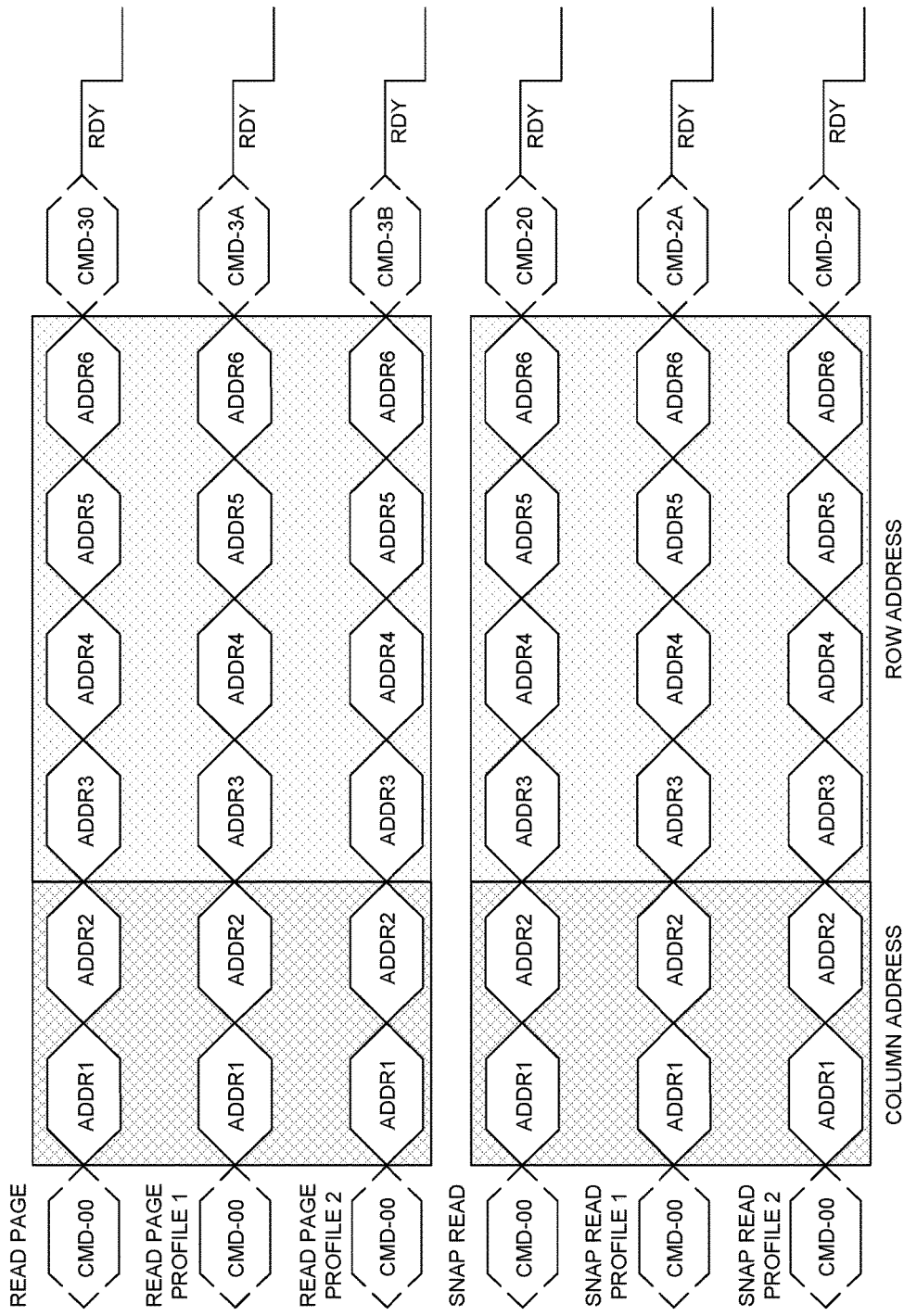
FIG. 6 illustrates example read commands including read voltage offset profile identifiers in a command cycle in accordance with certain embodiments.

FIG. 6 illustrates example read commands including read voltage offset profile identifiers in a command cycle in accordance with certain embodiments. In the embodiment depicted, each read command comprises a command cycle dedicated to communicate an opcode, followed by a plurality of address cycles and another command cycle dedicated to another opcode. In the embodiment depicted, the opcode in the first command cycle (i.e., 00 h) is common among the read commands and each opcode in the second command cycle signals the type of read command (i.e., read page or snap read in the depicted embodiment) as well as a read voltage offset profile ID to be used when performing the read command. For example, 30 h may specify a read page command without a read voltage offset profile, 3 Ah may specify a read page command and a first read voltage offset profile, 3 Bh may specify a read page command and a second read voltage offset profile, 20 h may specify a snap read command without a read voltage offset profile, 2 Ah may specify a snap read command and the first read voltage offset profile, and 2 Bh may specify a snap read command and the second read voltage offset profile.

The read commands each include two command cycles, two address cycles dedicated to a column address, and four address cycles dedicated to a row address (in this embodiment, the total number of address cycles in a command is one less than in the embodiment depicted in FIG. 5). In other embodiments, the read command may include any suitable number of command cycles and address cycles with at least one command cycle providing an indication of a read voltage offset profile ID. In various embodiments, vendor specific opcodes (e.g., as defined in Open NAND Flash Interface Specification, Revision 4.0) may be used to implement non-standard read commands (e.g., read commands that utilize an opcode specifying a type of read and a read voltage offset profile ID).

In the embodiment depicted, the last command cycle is used to communicate the read voltage offset profile ID. In various embodiments, any suitable command cycle may be used to communicate the read voltage offset profile ID. For example, in a particular embodiment, the first command cycle may communicate the read voltage offset profile ID.

Figure 7:
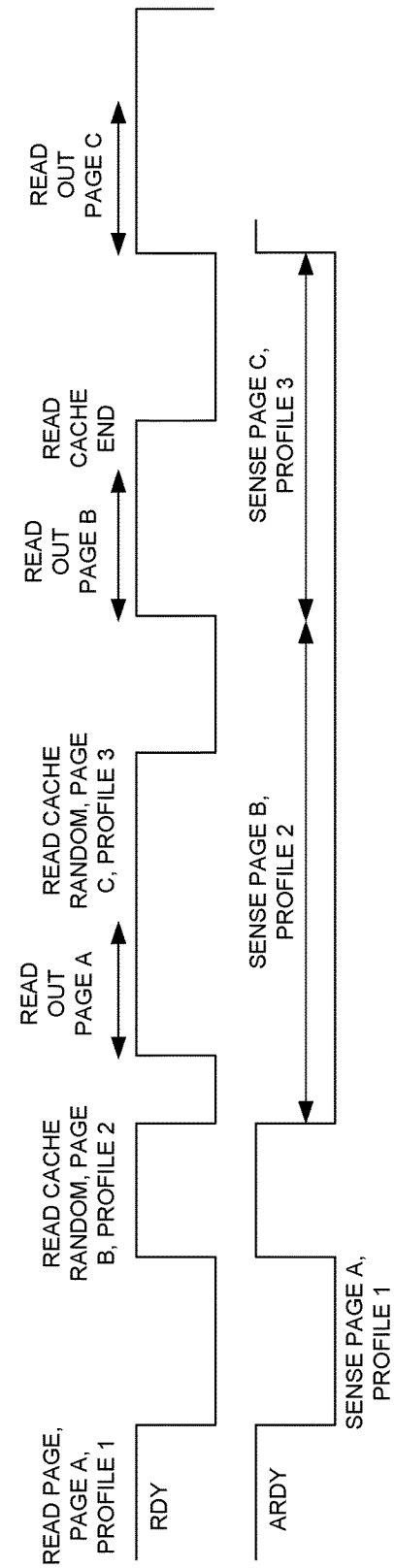
FIG. 7 illustrates example waveforms associated with read commands including read voltage offset profile identifiers in accordance with certain embodiments.

FIG. 7 illustrates example waveforms associated with read commands including read voltage offset profile identifiers in accordance with certain embodiments. A first waveform depicting a RDY signal may be a ready status output provided by memory device controller 126 to storage device controller 118 to indicate whether a memory chip 123 is ready to receive a command (e.g., when the RDY signal is low, the memory chip 123 is not available to receive a command and when RDY goes high the storage device controller 118 may send a new command). In a particular embodiment, the RDY signal is a bit of a read status output. A second waveform depicts an ARDY signal which is low when data is being sensed from an array of memory chip 123.

The sequence depicts performance of a read page and two read cache random operations. A read cache command (e.g., a read cache random or a read cache sequential) may permit a page to be read from a cache while another page is simultaneously read from a flash array for the selected memory chip. A read page command is issued prior to the initial read cache sequential or read cache random command in a read cache sequence. After one or more read cache sequential or read cache random commands are issued, a read cache end command is issued to complete the sequence.

The sequence depicted begins when the storage device controller 118 sends a read page command specifying an address of page A and a first read voltage offset profile ID (either in an address cycle or a command cycle of the command) to controller 126. Controller 126 then causes page A to be read from a memory array with read voltages adjusted according to the offsets specified in the read voltage offset profile corresponding to the ID. Once this read is complete, both the RDY and the ARDY signal go high.

A read cache random command is then sent from storage device controller 118 to controller 126. The read cache random command specifies an address of page B and a second read voltage offset profile ID (either in an address cycle or a command cycle of the command) to controller 126. Controller 126 then causes page B to be read from a memory array with read voltages adjusted according to the offsets specified in a different read voltage offset profile corresponding to the second ID. While page B is being sensed, the storage device controller 126 may read out page A from a cache. Storage device controller 118 may then send another read cache random command to controller 126. The read cache random command specifies an address of page C and a third read voltage offset profile ID (either in an address cycle or a command cycle of the command) to controller 126. The newly specified read voltage offset profile does not take effect until the corresponding page is read (i.e., the sensing of page B is allowed to continue with the voltage offsets specified by profile 2 and the voltage offsets specified by profile 3 are not applied to the read voltages until page C is sensed).

Once the sensing of page B is complete, storage device controller 118 may then read out page B from the cache while controller 126 causes page C to be read from a memory array with read voltages adjusted according to the offsets specified in the read voltage offset profile corresponding to the third ID. Controller 126 sends a read cache end command after reading out page B and then reads out page C once the sensing of page C is complete.

As described above, a cache read may include a read cache sequential command. In some embodiments, a read cache sequential command (or a standard read sequential command that does not utilize the caching sequence described above) may include a single command cycle without any address cycles. Such a command may represent a request to read the next page of the array (relative to the page that was just read by the array). In various embodiments, when such a command is issued, the controller 126 receiving the command may apply the read voltage offset profile that was used for the page that was previously read by the array. In an alternative embodiment, different opcodes for the single command cycle of the sequential read command may specify different read voltage offset profile IDs. For example, a first opcode may represent a sequential read command utilizing a first read voltage offset profile, a second opcode may represent a sequential read command utilizing a second read voltage offset profile, and so on.

Figure 8:
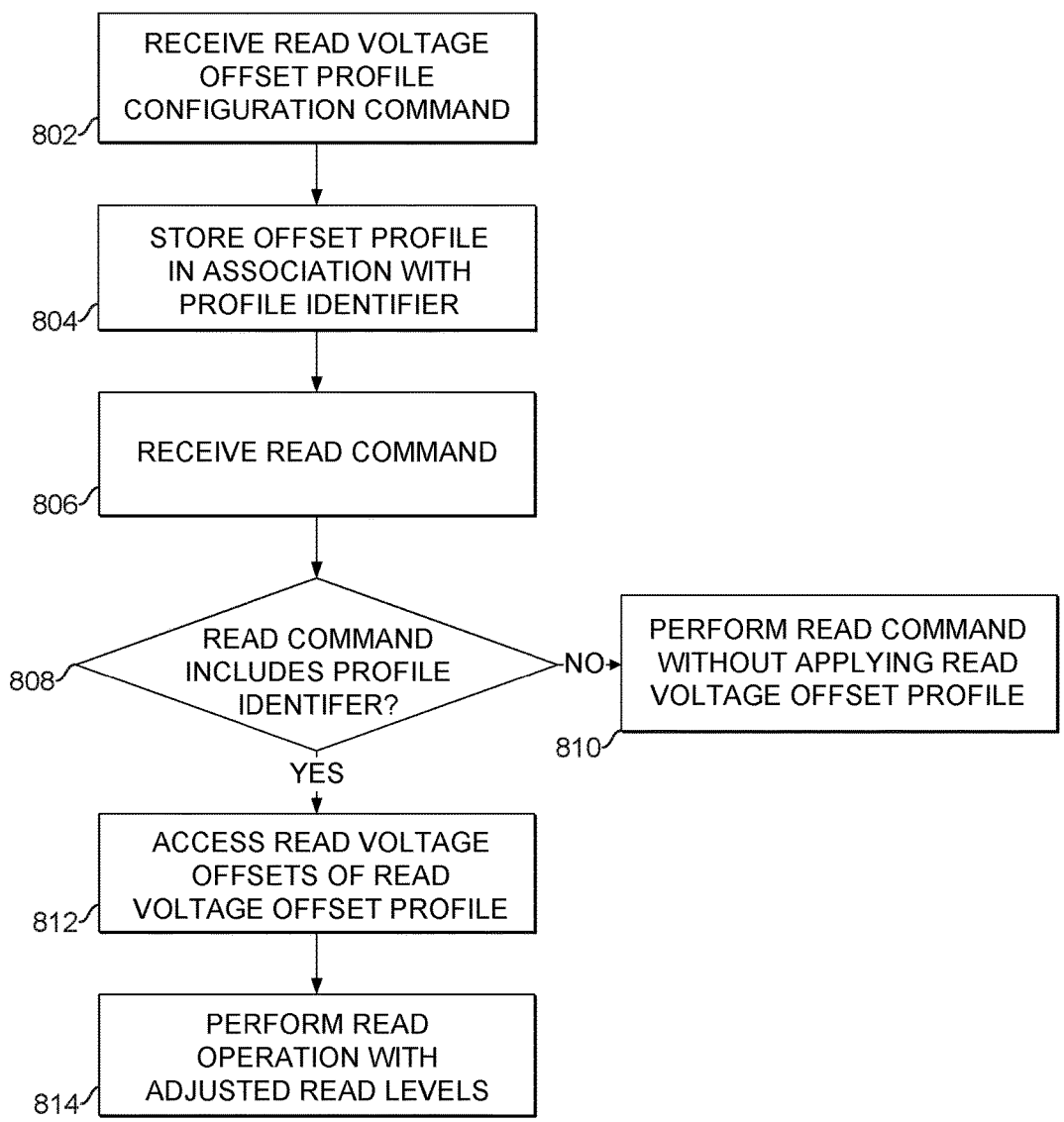
FIG. 8 illustrates an example flow for performing a read operation based on a read voltage offset profile in accordance with certain embodiments.

FIG. 8 illustrates an example flow for performing a read operation based on a read voltage offset profile in accordance with certain embodiments. The flow may be performed by any suitable logic of system 100, such as a memory device controller 126.

At 802, a read voltage offset profile configuration command is received. For example, the read voltage offset profile configuration command may be received from the storage device controller 118. In a particular embodiment, the configuration command may specify one or more read voltage offsets of a read voltage offset profile. In an embodiment, the configuration command may specify a read voltage offset for each read voltage applied during a read operation. For example, if an SLC scheme is used, the configuration command may include a single read voltage offset. As another example, if an MLC scheme is used, the configuration command may include three read voltage offsets. As another example, if a TLC scheme is used, the configuration command may include seven read voltage offsets. As yet another example, if a QLC scheme is used, the configuration command may include fifteen read voltage offsets.

In a particular embodiment, a configuration command may include a set of read voltage offsets for each profile of a plurality of read voltage offset profiles. For example, the configuration command may include a first set of voltage offsets for a first read voltage offset profile, a second set of voltage offsets for a second read voltage offset profile, and so on. In other embodiments, multiple configuration commands may be used when multiple read voltage offset profiles are to be established.

In a particular embodiment, a configuration command may include a read voltage offset profile identifier to be associated with a set of read voltage offsets of a profile. In another embodiment, the configuration command may include a representation of a read voltage offset profile identifier, rather than the read voltage offset profile identifier itself, such that the controller 126 may determine the read voltage offset profile identifier based on the representation. In yet another embodiment, the configuration command may be structured in an order that allows controller 126 to determine an association between a set of read voltage offsets and a corresponding read voltage offset profile identifier. For example, the order of read voltage offsets included in a configuration command specifying a plurality of different read voltage offset profiles may be indicative of the profile identifier to which each set of read voltage offsets belongs.

In a particular embodiment, the storage device controller 118 or other suitable logic of system 100 (e.g., system media management) may perform a series of tests on a memory chip 123 to determine optimal read voltage offset profiles prior to sending one or more configuration commands to controller 126. For example, the storage device controller 118 may direct the programming of various pages to an array of memory chip 123 and read the pages at various times to determine whether the optimal read voltage levels have shifted. As part of this testing, the storage device controller 118 may monitor error correction logic to determine whether various read voltage levels should be adjusted to improve sensing accuracy. Storage device controller 118 may also direct the adjustment of various read voltages to determine optimal read voltage offsets for particular situations (e.g., based on the amount of time since data was refreshed or programmed or based on the location of data). Based on these tests, the storage device controller 118 may determine one or more read voltage offset profiles to be used during operation of the memory chip 123.

At 804, a read voltage offset profile is stored in association with a profile identifier. The read voltage offset profile and/or the profile identifier may be stored in any suitable location accessible to controller 126 or other logic associated with the application of read voltages during a read operation. For example, the read voltage offset profile and/or the profile identifier are stored in a memory of a memory chip 123, in a memory of a controller 126, or other memory of a memory device 122. In a particular embodiment, the read voltage offset profile and/or the profile identifier is stored in a memory that may be accessed relatively quickly, such as an SRAM. In particular embodiments, the profile identifiers are not explicitly stored, but rather are inferred based on the location of a read voltage offset profile within the memory. For example, a read voltage offset profile stored in a first storage element of a memory may be associated with a first profile identifier, a read voltage offset profile stored in an adjacent storage element of a memory may be associated with the second profile identifier, and so on. In one embodiment, the read voltage offset profiles and their corresponding profile identifiers may be stored in a lookup table.

In a particular embodiment, once a storage device controller 118 has generated one or more read voltage offset profiles based on the aforementioned tests, the storage device controller 118 may send one or more configuration commands to cause controller 126 to store the read voltage offset profiles in association with respective read voltage offset profile identifiers.

At 806, a read command is received. At 808, a determination is made as to whether the read command includes a read voltage offset profile identifier. In a particular embodiment, a read command may specify data to be read as well as a read voltage offset profile identifier. In various examples, the read voltage offset profile identifier may be included within or inferred from a value included in an address cycle of the read command or a command cycle of the read command.

If the read command does not include a read voltage offset profile identifier, a read command is performed without applying a read voltage offset profile at 810. In some embodiments, the read command may also be performed without applying a read voltage offset profile if the read command specifies a default voltage offset profile identifier.

If the read command includes a read voltage offset profile identifier, controller 126 or other suitable logic accesses one or more read voltage offsets of a read voltage offset profile associated with the identifier at 812. At 814, the read operation is performed with voltage levels adjusted based on the read voltage offsets of the read voltage offset profile. For example, a first read voltage may be adjusted by a first read voltage offset specified by the profile, a second read voltage may be adjusted by a second read voltage offset specified by the profile, and so on.

The flows described in FIGS. 5-8 are merely representative of operations that may occur in particular embodiments. In other embodiments, additional operations may be performed in the flows (e.g., the various memory cells of the array may be formed). Various embodiments of the present disclosure contemplate any suitable signaling mechanisms for accomplishing the functions described herein. Some of the operations illustrated in FIGS. 5-8 may be repeated, combined, modified, or deleted where appropriate. Additionally, operations may be performed in any suitable order without departing from the scope of particular embodiments.

In a particular embodiment, storage device controller 118 or other suitable logic of system 100 may determine the read voltage offset profile for the read command based on any suitable information, such as an amount of time that has elapsed since the data to be read was programmed or refreshed, the location of the data to be read, or other suitable factors. For example, the storage device controller 118 may receive a request for data from a host (e.g., CPU 102) and may translate the request into one or more read commands and associated read voltage offset profile identifiers before communicating the one or more read commands to controller 126.

Any suitable type of read operation may utilize read voltage offset profiles (where the read voltage offset profile identifier may be specified within a command cycle or an address cycle of the corresponding command or a related command). For example, the storage device 106 may support any one or more of the following read commands: a read page command (which performs a random read of a page of data), a read multi-plane command (described below), a read cache random command (as described above), a read cache sequential command (as described above), a snap read (which performs a random read of a partial page of data), a corrective read (described below), and a soft bit read (described below).

A multiplane read operation may specify the locations of data to be read from multiple different planes simultaneously (e.g., the data located at the page address of a first plane is read at the same time as the data located at the page address of a second plane). For example, a multiplane read command may specify a common page address for the data to be read (though the column address and/or block address of each set of data to be read from the various planes may be different) as well as how many/which planes are to be read from. In a particular embodiment, a multiplane read command may specify a single read voltage offset profile identifier that is used for each page read from the various planes. In a particular embodiment, the same read voltage offset profile is used because a multiplane read operation utilizes a single word line driver to apply the read voltages for the multiple reads performed.

A corrective read may include an operation wherein a program status of one or more wordlines adjacent to the word line of the data to be read is checked to determine whether one or more read voltage offsets should be applied during the read operation to correct for threshold voltage disturbance caused by the programming of the adjacent word line(s). When a corrective read command specifies a read voltage offset profile identifier, the read voltage offsets in the corresponding read voltage offset profile may be added to any read voltage offsets to be applied based on the program status of the adjacent word line(s).

A soft bit read command may result in a first read operation being performed at default read voltages, and one or more read operations being performed at read voltages that are each shifted from the default read voltages by a particular amount. For example, a first read operation may be performed at the default read voltages, a second read operation may be performed using read voltages that are 0.1 V less than the default read voltages, and a third read operation may be performed using read voltages that are 0.1 V more than the default read voltages. The results of the read operations may be obtained by the storage device controller 118 and analyzed to determine which sensing operation was the most accurate, and may return these results to the requesting entity (for example, CPU 102). When a soft a bit read command specifies a read voltage offset profile identifier, the read voltage offsets in the corresponding read voltage offset profile may be added to the read voltages that would normally be used in the soft bit read command for the various read operations.

As described above with respect to the soft bit read command and the corrective read command, in particular embodiments, read voltage adjustment based on a read voltage offset profile may be cumulative with other read voltage adjustments implemented by a storage device. One particular read voltage adjustment procedure implemented by a storage device is a moving read reference (MRR) operation. In a moving read reference operation, a read voltage offset may be specified for one or more read voltages. This moving read reference operation may adjust one or more read voltages using any suitable granularity of a memory array, such as a block (for example, the adjusted read voltages may be applied to each word line of the block). The read voltage adjustments specified by an MRR operation may be used during any suitable read operation. Read voltage offsets specified by a read voltage offset profile to be used for a read command may be cumulative with read voltage adjustments specified by an MRR operation. In a particular embodiment, the range and resolution of read voltage offsets specified by an MRR operation may be the same as the range and resolution of read voltage offsets of a read voltage offset profile.

Another read voltage adjustment procedure implemented by a storage device is a channel calibration procedure (sometimes referred to as auto-read calibration). In a channel calibration procedure, the memory chip 123 calibrates a portion of its memory (e.g., a page) and stores optimal read voltage offsets based on the calibration. The stored read voltage offsets may then be used for read operations involving the calibrated portion of memory. Read voltage offsets specified by a read voltage offset profile to be used for a read command may be cumulative with read voltage offsets determined during a channel calibration procedure.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122A-D, memory chips 123, controllers 126, storage device controller 118, address translation engine 120, program control logic 124, memory array 200, memory 402, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1 's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a memory array; and a controller to receive a first read command specifying a read voltage offset profile identifier; identify a read voltage offset profile associated with the read voltage offset profile identifier, the read voltage offset profile comprising at least one read voltage offset; and perform a first read operation specified by the first read command using at least one read voltage adjusted according to the at least one read voltage offset of the read voltage offset profile.

In an embodiment, the read voltage offset profile identifier is specified in an address cycle of the read command. In an embodiment, the controller is to receive a second read command specifying a default read voltage offset profile identifier in an address cycle of the read command; and determine not to adjust the at least one read voltage based on the default read voltage offset profile identifier for a second read operation. In an embodiment, the read voltage offset profile identifier is specified in a last address cycle of the read command. In an embodiment, the read voltage offset profile identifier is specified in a command cycle of the first read command. In an embodiment, the read voltage offset profile identifier is specified in an op code transmitted during a last command cycle of the first read command. In an embodiment, the read voltage offset profile identifier is specified in an op code transmitted during a first command cycle of the first read command. In an embodiment, the controller further is to receive a configuration command specifying the at least one read offset voltage and the read voltage offset profile identifier; and store, in a memory, the at least one read offset voltages in association with the read voltage offset profile identifier. In an embodiment, an apparatus further comprises a second controller to select the read voltage offset profile identifier from a plurality of read voltage offset profile identifiers based on an age of data targeted by the read command. In an embodiment, the read command is a multiplane read command and the at least one adjusted read voltage is applied to read data from each plane of a plurality of planes specified in the multiplane read command.

In at least one embodiment, a method comprises receiving a first read command specifying a read voltage offset profile identifier; identifying a read voltage offset profile associated with the read voltage offset profile identifier, the read voltage offset profile comprising at least one read voltage offset; and performing a first read operation specified by the first read command using at least one adjusted read voltage adjusted according to the at least one read voltage offset of the read voltage offset profile.

In an embodiment, a method further comprises specifying the read voltage offset profile identifier in an address cycle of the read command. In an embodiment, a method further comprises receiving a second read command specifying a default read voltage offset profile identifier in an address cycle of the read command; and determining not to adjust the at least one read voltage based on the default read voltage offset profile identifier for a second read operation. In an embodiment, a method further comprises specifying the read voltage offset profile identifier in a last address cycle of the read command. In an embodiment, a method further comprises specifying the read voltage offset profile identifier in a command cycle of the first read command. In an embodiment, a method further comprises specifying the read voltage offset profile identifier in an op code transmitted during a last command cycle of the first read command. In an embodiment, a method further comprises specifying the read voltage offset profile identifier in an op code transmitted during a first command cycle of the first read command. In an embodiment, a method further comprises receiving a configuration command specifying the at least one read offset voltage and the read voltage offset profile identifier; and storing, in a memory, the at least one read offset voltages in association with the read voltage offset profile identifier. In an embodiment, a method further comprises selecting the read voltage offset profile identifier from a plurality of read voltage offset profile identifiers based on an age of data targeted by the read command. In an embodiment, the read command is a multiplane read command and the at least one adjusted read voltage is applied to read data from each plane of a plurality of planes specified in the multiplane read command.

In at least one embodiment, a non-transitory machine readable storage medium has instructions stored thereon, the instructions when executed by a machine to cause the machine to receive a first read command specifying a read voltage offset profile identifier; identify a read voltage offset profile associated with the read voltage offset profile identifier, the read voltage offset profile comprising at least one read voltage offset; and perform a first read operation specified by the first read command using at least one read voltage adjusted according to the at least one read voltage offset of the read voltage offset profile.

In an embodiment, the instructions when executed cause the machine to specify the read voltage offset profile identifier in an address cycle of the read command. In an embodiment, the instructions when executed cause the machine to specify the read voltage offset profile identifier in a command cycle of the first read command. In an embodiment, the instructions when executed cause the machine to receive a configuration command specifying the at least one read offset voltage and the read voltage offset profile identifier; and store, in a memory, the at least one read offset voltages in association with the read voltage offset profile identifier. In an embodiment, the instructions when executed cause the machine to select the read voltage offset profile identifier from a plurality of read voltage offset profile identifiers based on an age of data targeted by the read command.

In at least one embodiment, a system comprises a storage device comprising a memory device comprising a memory array and a first controller; and a second controller to send a configuration command to the first controller, the configuration command specifying at least one read offset voltage and a read voltage offset profile identifier; and send a read command to the first controller, the read command specifying the read voltage offset profile identifier and an address of the memory array.

In an embodiment, the second controller is to receive data specified by the address of the memory array, the data read by the first controller in accordance with the at least one read offset voltage. In an embodiment, the read command specifies the read voltage offset profile identifier in a command cycle or an address cycle of the read command. In an embodiment, a system further comprises a processor to send a read request to the storage device and wherein the second controller is to send the read command in response to receiving the read request. In an embodiment, a system further comprises a battery communicatively coupled to the processor, a display communicatively coupled to the processor, or a network interface communicatively coupled to the processor.

In at least one embodiment, a system comprises means for receiving a first read command specifying a read voltage offset profile identifier; means for identifying a read voltage offset profile associated with the read voltage offset profile identifier, the read voltage offset profile comprising at least one read voltage offset; and means for performing a first read operation specified by the first read command using at least one read voltage adjusted according to the at least one read voltage offset of the read voltage offset profile.

In an embodiment, the system further comprises means for specifying the read voltage offset profile identifier in an address cycle of the read command. In an embodiment, the system further comprises means for specifying the read voltage offset profile identifier in a command cycle of the first read command. In an embodiment, the system further comprises means for receiving a configuration command specifying the at least one read offset voltage and the read voltage offset profile identifier; and means for storing, in a memory, the at least one read offset voltages in association with the read voltage offset profile identifier. In an embodiment, the system further comprises means for selecting the read voltage offset profile identifier from a plurality of read voltage offset profile identifiers based on an age of data targeted by the read command.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a memory array; and
a controller to:
receive a first read command specifying a read voltage offset profile identifier;
identify a read voltage offset profile associated with the read voltage offset profile identifier, the read voltage offset profile comprising at least one read voltage offset, wherein a read voltage offset of the at least one read voltage offset is specified as an amount to shift a corresponding read voltage, wherein the corresponding read voltage is to be applied during a read operation specified by a second read command that specifies a same type of read as the first read command; and
perform a first read operation specified by the first read command using at least one read voltage adjusted according to the at least one read voltage offset of the read voltage offset profile.

2. The apparatus of claim 1, wherein the read voltage offset profile identifier is specified in an address cycle of the first read command.

3. The apparatus of claim 1, wherein the controller is to:
receive a third read command specifying a default read voltage offset profile identifier in an address cycle of the third read command; and
determine not to adjust the at least one read voltage based on the default read voltage offset profile identifier for a second read operation.

4. The apparatus of claim 1, wherein the read voltage offset profile identifier is specified in a last address cycle of the first read command.

5. The apparatus of claim 1, wherein the read voltage offset profile identifier is specified in a command cycle of the first read command.

6. The apparatus of claim 1, wherein the read voltage offset profile identifier is specified in an op code transmitted during a last command cycle of the first read command.

7. The apparatus of claim 1, wherein the read voltage offset profile identifier is specified in an op code transmitted during a first command cycle of the first read command.

8. The apparatus of claim 1, the controller further to:
receive a configuration command including the at least one read offset voltage and the read voltage offset profile identifier; and
in response to the configuration command, store, in a memory, the at least one read offset voltage in association with the read voltage offset profile identifier.

9. The apparatus of claim 1, further comprising a second controller to select the read voltage offset profile identifier from a plurality of read voltage offset profile identifiers based on an age of data targeted by the first read command.

10. The apparatus of claim 1, wherein the first read command is a multiplane read command and the at least one adjusted read voltage is applied to read data from each plane of a plurality of planes specified in the multiplane read command.

11. A method comprising:
receiving a first read command specifying a read voltage offset profile identifier;
identifying a read voltage offset profile associated with the read voltage offset profile identifier, the read voltage offset profile comprising at least one read voltage offset, wherein a read voltage offset of the at least one read voltage offset is specified as an amount to shift a corresponding read voltage, wherein the corresponding read voltage is to be applied during a read operation specified by a second read command that specifies a same type of read as the first read command; and
performing a first read operation specified by the first read command using at least one read voltage adjusted according to the at least one read voltage offset of the read voltage offset profile.

12. The method of claim 11, further comprising specifying the read voltage offset profile identifier in an address cycle of the first read command.

13. The method of claim 11, further comprising specifying the read voltage offset profile identifier in a command cycle of the first read command.

14. The method of claim 11, further comprising:
receiving a configuration command including the at least one read offset voltage and the read voltage offset profile identifier; and
in response to the configuration command, storing, in a memory, the at least one read offset voltage in association with the read voltage offset profile identifier.

15. The method of claim 11, further comprising selecting the read voltage offset profile identifier from a plurality of read voltage offset profile identifiers based on an age of data targeted by the first read command.

16. A system comprising:
a storage device comprising:
a memory device comprising a memory array and a first controller; and
a second controller to:
send a configuration command to the first controller, the configuration command specifying at least one read offset voltage and a read voltage offset profile identifier; and
send a first read command to the first controller, the first read command specifying the read voltage offset profile identifier and an address of the memory array wherein the first controller is to:
receive the first read command specifying the read voltage offset profile identifier;
identify a read voltage offset profile associated with the read voltage offset profile identifier, the read voltage offset profile comprising the at least one read voltage offset, wherein a read voltage offset of the at least one read voltage offset is specified as an amount to shift a corresponding read voltage, wherein the corresponding read voltage is to be applied during a read operation specified by a second read command that specifies a same type of read as the first read command; and
perform a first read operation specified by the first read command using at least one read voltage adjusted according to the at least one read voltage offset of the read voltage offset profile.

17. The system of claim 16, the second controller to receive data specified by the address of the memory array, the data read by the first controller in accordance with the at least one read offset voltage.

18. The system of claim 16, wherein the first read command specifies the read voltage offset profile identifier in a command cycle or an address cycle of the first read command.

19. The system of claim 16, further comprising a processor to send a read request to the storage device and wherein the second controller is to send the first read command in response to receiving the read request.

20. The system of claim 19, further comprising a battery communicatively coupled to the processor, a display communicatively coupled to the processor, or a network interface communicatively coupled to the processor.

* * * * *